United States Patent [19]

Chung et al.

[11] Patent Number: 5,257,039
[45] Date of Patent: Oct. 26, 1993

[54] NON-IMPACT PRINTHEAD AND DRIVER CIRCUIT FOR USE THEREWITH

[75] Inventors: Jeremy K. Chung; Kenneth D. Kieffer; Pin S. Tschang, all of Rochester, N.Y.

[73] Assignee: Eastman Kodak Company, Rochester, N.Y.

[21] Appl. No.: 764,268

[22] Filed: Sep. 23, 1991

[51] Int. Cl.⁵ ............... G01D 15/00; H03M 1/80; G05F 3/16
[52] U.S. Cl. ................ 346/107 R; 341/153; 323/315
[58] Field of Search ............ 346/107 R; 323/315, 323/316, 317, 907; 341/145, 153, 154; 330/288

[56] References Cited

U.S. PATENT DOCUMENTS

| | | | |
|---|---|---|---|
| 3,936,725 | 2/1976 | Schneider | 323/315 |
| 3,978,473 | 8/1976 | Pastoriza | 340/347 DA |
| 4,442,398 | 4/1984 | Bertails | 323/315 |
| 4,645,948 | 2/1987 | Morris et al. | 323/315 X |
| 4,658,240 | 4/1987 | Bixby | 340/347 AD |
| 4,864,215 | 9/1989 | Schouwenaars et al. | |
| 4,872,011 | 10/1989 | Pelgrom et al. | 341/153 X |
| 4,885,597 | 12/1989 | Tshang et al. | 346/154 X |
| 5,015,942 | 5/1991 | Kolanko | |
| 5,017,919 | 5/1991 | Hull et al. | |
| 5,099,205 | 3/1992 | Lewyn | 323/315 X |

OTHER PUBLICATIONS

"Analysis and Design of Analog Integrated Circuits", Article, 2nd Ed., pp. 733–735, by Gray and Meyer.

Primary Examiner—Benjamin R. Fuller
Assistant Examiner—David Yockey
Attorney, Agent, or Firm—Norman Rushefsky

[57] ABSTRACT

A non-impact printhead, for example one that includes a plurality of LEDs, is driven by a current that is programmed to have a linear temperature profile with a desired slope. The change in current with temperature facilitates maintaining of LED uniformity. Linearity between various stages of driver circuitry is maintained by a digital-to-analog converter that includes transistors arranged in a common centroid configuration. Driver current to each LED is provided by a master slave circuit that is dedicated to each LED. Thus, cross-talk between LED channels is minimized.

38 Claims, 12 Drawing Sheets

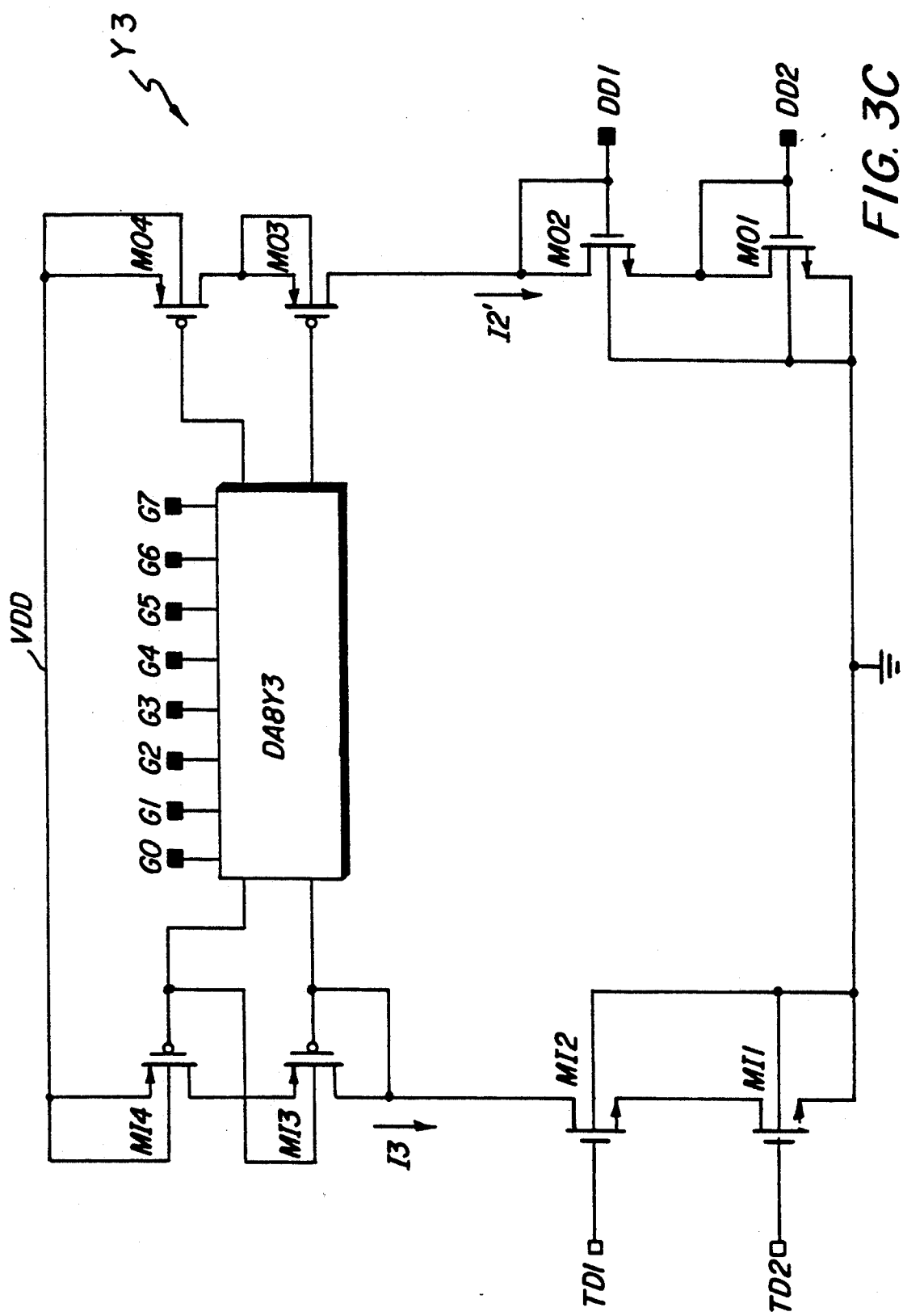

TABLE 1 TRANSISTOR SIZING FOR CIRCUIT Y5 (IN MICRONS)

| | | | |
|---|---|---|---|
| MB1 | 9/4.8 | MO1 | 5.4/2.4 |
| MB2 | 4/7.6 | MO2 | 5.4/2.4 |
| MB3 | 4/2 | MO3 | 2.4/2.4 |
| $R_J$ | 50KΩ | MO4 | 2.4/2.4 |
| MI1 | 28/2.4 | MJ1 | 28/2.4 |
| MI2 | 28/2.4 | MJ2 | 28/2.4 |
| MI4 | 4/2 | MJ4 | 4/2 |

TABLE 2 TRANSISTOR SIZING FOR CIRCUIT Y4 (IN MICRONS)

| | | | |
|---|---|---|---|
| M1 | 4/2 | M23 | 17.6/9.6 |
| M1B | 40/2 | M23B | 17.6/9.6 |
| M2 | 10/2 | M24 | 10.8/2 |
| M2B | 10/2 | M24B | 10.8/2 |
| M3 | 400/2 | M33 | 4/7.2 |
| M3B | 4000/2 | M33B | 4/7.2 |
| M4 | 80/2 | M34 | 10.8/2 |
| M4B | 80/2 | M34B | 10.8/2 |
| M13 | 9.6/2 | M43 | 2.4/2.4 |
| M13B | 9.6/2 | M43B | 2.4/2.4 |
| M14 | 80/2 | | |
| M14B | 80/2 | $R_B$ | 40K |

TABLE 3 TRANSISTOR SIZING FOR CIRCUIT Y4P (IN MICRONS)

| | | | |
|---|---|---|---|
| MR0 | 20/2 | MR8 | 20/2 |
| MR1 | 20/2 | MR9 | 20/2 |
| MR2 | 20/2 | MR10 | 20/2 |
| MR3 | 20/2 | MR11 | 20/2 |
| MR4 | 20/2 | MR12 | 20/2 |
| MR5 | 20/2 | MR13 | 20/2 |
| MR6 | 20/2 | MR14 | 20/2 |
| MR7 | 20/2 | MR15 | 20/2 |
| | | $R_A$ | 5.5KΩ |

TABLE 4 TRANSISTOR SIZING FOR CIRCUIT Y3 (IN MICRONS)

| | | | |
|---|---|---|---|
| MI1 | 8/7.2 | MO1 | 2.4/2.4 |
| MI2 | 8/7.2 | MO2 | 2.4/2.4 |
| MI3 | 5.6/2.4 | MO3 | 5.6/2.4 |
| MI4 | 5.6/2.4 | MO4 | 5.6/2.4 |

FIG. 4A

TABLE 5 TRANSISTOR SIZING FOR CIRCUIT Y2 (IN MICRONS)

| | | | |
|---|---|---|---|
| MI1 | 2.4/2.4 | MO1 | 12/2 |
| MI2 | 2.4/2.4 | MO2 | 12/2 |
| MI3 | 5.6/2.4 | MO3 | 67.2/2.4 |
| M4  | 5.6/2.4 | MO4 | 67.2/2.4 |

TABLE 6 TRANSISTOR SIZING FOR CIRCUIT Y1 (IN MICRONS)

| | | | |
|---|---|---|---|
| MOAX | 30.4/2 | M1AX | 1656/2 |
| MOBX | 30.4/2 | M1BX | 1656/2 |
| MOCX | 12/2 | M2AX | 20/2 |
| MODX | 12/2 | M2BX | 20/2 |

TABLE 7 TRANSISTOR SIZING FOR CIRCUIT DA8Y (IN MICRONS)

| | | | |
|---|---|---|---|
| MI1 | 2.4/2.4 | M31 | 5.6/2.4 |
| MI2 | 2.4/2.4 | M32 | 5.6/2.4 |
| MI3 | 5.6/2.4 | M33 | 19.2/2.4 |
| MI4 | 5.6/2.4 | M34 | 19.2/2.4 |
| MJ1 | 716.8/2.4 | M41 | 5.6/2.4 |
| MJ2 | 716.8/2.4 | M42 | 5.6/2.4 |
|  |  | M43 | 38.4/2.4 |
|  |  | M44 | 38.4/2.4 |
| MO1 | 5.6/2.4 | M51 | 5.6/2.4 |
| MO2 | 5.6/2.4 | M52 | 5.6/2.4 |
| MO3 | 2.4/2.4 | M53 | 76.8/2.4 |
| MO4 | 2.4/2.4 | M54 | 76.8/2.4 |
| M11 | 5.6/2.4 | M61 | 5.6/2.4 |
| M12 | 5.6/2.4 | M62 | 5.6/2.4 |
| M13 | 4.8/2.4 | M63 | 153.6/2.4 |
| M14 | 4.8/2.4 | M64 | 153.6/2.4 |
| M21 | 5.6/2.4 | M72 | 5.6/2.4 |
| M22 | 5.6/2.4 | M71 | 5.6/2.4 |
| M23 | 9.6/2.4 | M73 | 307.2/2.4 |
| M24 | 9.6/2.4 | M74 | 307.2/2.4 |

FIG. 4B

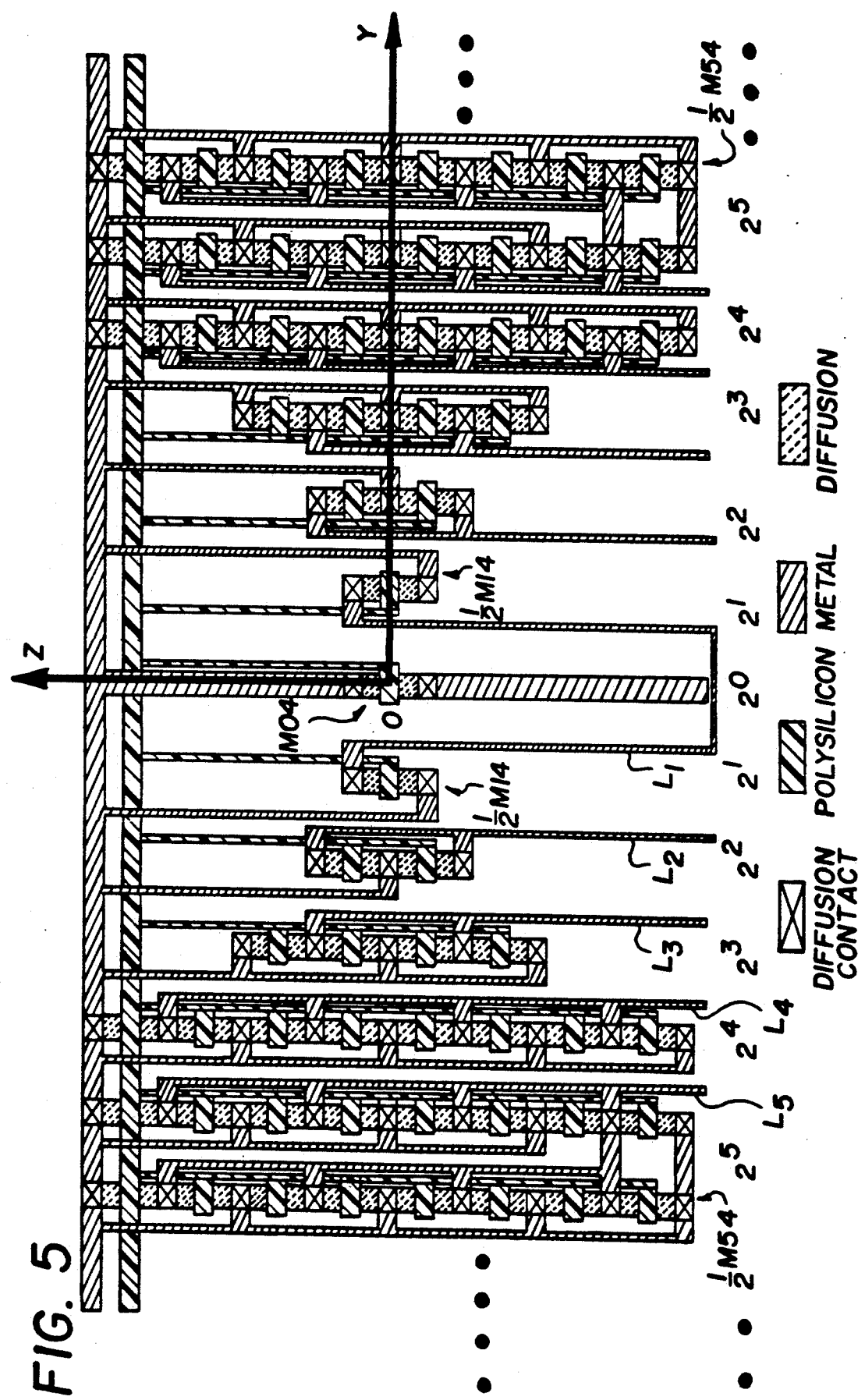

NON-IMPACT PRINTHEAD AND DRIVER CIRCUIT FOR USE THEREWITH

BACKGROUND OF THE INVENTION

1. Field of the Invention

The invention relates to driver circuitry for driving recording elements for non-impact printing and more particularly relates to driver circuitry for driving light-emitting diodes (LEDs) on a printhead with improved compensation for nonuniformities in light outputs arising from temperature differences on the printhead.

2. Description of the Prior Art

In the prior art, as exemplified by U.S. Pat. No. 4,885,597, the contents of which are incorporated herein by this reference, an LED printhead is described for recording by modifying an electrostatic charge on a photoconductive web. LED printheads, as known in the art, include a single row of LEDs formed in chip arrays. Each array may contain say 192 LEDs. As may be seen from FIG. 1, the arrays 31 are mounted end to end on the printhead 20 so that a single row of several thousand LEDs 30 is provided. Driver chips 40 may be mounted on one or both sides of this row of LEDs and these chips incorporate the circuitry for handling the data signals to determine which LEDs are to be turned on or illuminated during a pixel (picture element) recording period and for providing the driving currents to the LEDs turned on. In one typical application, two driver chips incorporate the circuitry for driving the 192 LEDs on a chip array. One of these driver chips will be used to drive the 96 odd-numbered LEDs and the other will be used to drive the 96 even-numbered LEDs. Signal carrying lines 33, 34, 35, 36 and 37 are provided to carry signals from a logic control unit and power supply to control operation of the printhead.

As noted in this patent, temperature gradients appear along the length of the printheads. The LEDs are temperature-sensitive and their respective light outputs for the same amount of driving currents are adversely affected. Thus, illumination uniformity suffers and concomitant image deterioration results. To offset this, the referenced patent teaches the use of modifying the driver currents respectively in accordance with temperature measured close to the driver chips to compensate for the change in light output due to the LEDs rise in temperature. In accordance with the circuit described in this referenced patent, a digitally addressable current regulation circuit is provided on each driver chip. This circuit drives the LEDs through a current mirror with the currents through the LEDs being slaved to that in the master circuit. The current in the master circuit is regulated with a digital word stored on the driver chip. This digital word is changed periodically with changes of temperature, thereby causing change in the level of current in the master circuit, and concomitantly, in the level of current to the LEDs. This approach works well when temperature changes are relatively slow so that infrequent changes to the digital word may be made. However, where exacting image reproduction is desired, the circuit described in this patent presents some problems. In order to change the digital word more frequently, communication with say a logic controller must be had requiring lines and attachment connections. Additional lines and connections to a printhead use up precious "real estate" on the printhead. To minimize the use of this real estate, it has been proposed in U.S. application Ser. No. 07/543,929, filed Jun. 26 1990 in the names of Potucek et al to employ data lines for passing image data signals to the printhead for also passing digital current regulation data. While this approach alone saves "real estate", the passing of current regulation data may be required only during interframes for recording or other nonproduction intervals. While an embodiment disclosed in the Potucek et al application describes a circuit for accomplishing line by line changes to both image data and current regulation data, such circuit may require a higher speed clocking capability than desired. The Potucek et al application also overcomes the problem of temperature-related changes in LED uniformity by providing a circuit including a resistor having a positive temperature coefficient in combination with a bipolar transistor. Incorporating such a resistor on a so-called $V_T$ (thermal voltage) reference source provides a current that increases with temperature. This current is then used as a reference for generating the master current in the driver circuit for driving the LEDs. Thus, as temperature of the driver chip increases, and concomitantly its adjacent LED array, the current to the LEDs increase to offset reduction in efficiency due to temperature.

A problem with the above approach is providing a reference current that increases linearly with temperature. Such an increase is desirable since it provides a reasonably satisfactory approximation of the requirements of the LEDs for maintaining uniformity of light output. A further problem is that it would be desirable to provide such a reference current source that has a temperature coefficient that is programmable to provide further flexibility in allowing adjustments to be made to best approximate the behavior of the LEDs. For example, LEDs produced from different batches may exhibit uniformity fall-off at different rates. A circuit that can be programmed to offset this fall-off with good approximation would be highly desirable.

SUMMARY OF THE INVENTION

It is therefore an object of the invention to provide an improved printhead and circuit for a driver chip for use in overcoming the problems set forth above. These and other objects which will become apparent are realized in accordance with one aspect of the invention by a printhead including a recording element energizable for emitting radiation used in recording; and driver circuitry for providing driving current to energize the recording element, the driver circuitry including a plurality of MOS transistors arranged in a cascode current mirror configuration and biased in the weak-inversion saturated region to generate a driving current with a generally linear temperature profile.

In accordance with another aspect of the invention, there is provided a printhead comprising: a plurality of recording elements energizable for emitting radiation used in recording; and driver circuitry means including a plurality of master-slave current mirrors for generating driving currents to energize respective recording elements, each recording element being a part of a slave leg of each current mirror and each master circuit being associated with only one recording element.

In accordance with yet another aspect of the invention, there is provided a printhead comprising: a recording element energizable for emitting radiation used in recording, and driver circuitry for providing driving current to energize the recording element; the driver circuitry including a digital-to-analog converter for modifying a level of current to the recording element, the converter including a plurality of unit transistors arranged in a common centroid configuration, wherein the unit transistors of the converter are connected in groups to form binary weighted transistor groups, and wherein binary weighted groups of progressively higher binary weight are located progressively farther from the centroid.

In accordance with other aspects of the invention, there is provided driver circuitry as described above.

BRIEF DESCRIPTION OF THE DRAWINGS

FIGS. 3A through 3G are a schematic of the portion of the driver chip shown in FIG. 2;

FIGS. 4A, 4B is a chart of the width to length parameters in microns of the transistors illustrated in FIGS. 3A through 3G; and FIG. 5 is a schematic illustrating a layout of a portion of a digital-to-analog converter showing transistors arranged as groups of unit transistors in a common centroid configuration.

DETAILED DESCRIPTION OF THE PREFERRED EMBODIMENT

In the description below, details are provided regarding one or more exemplary embodiments forming the present invention. Apparatus and/or circuitry not specifically shown or described herein are selectable from those known in the prior art.

Figure 1:
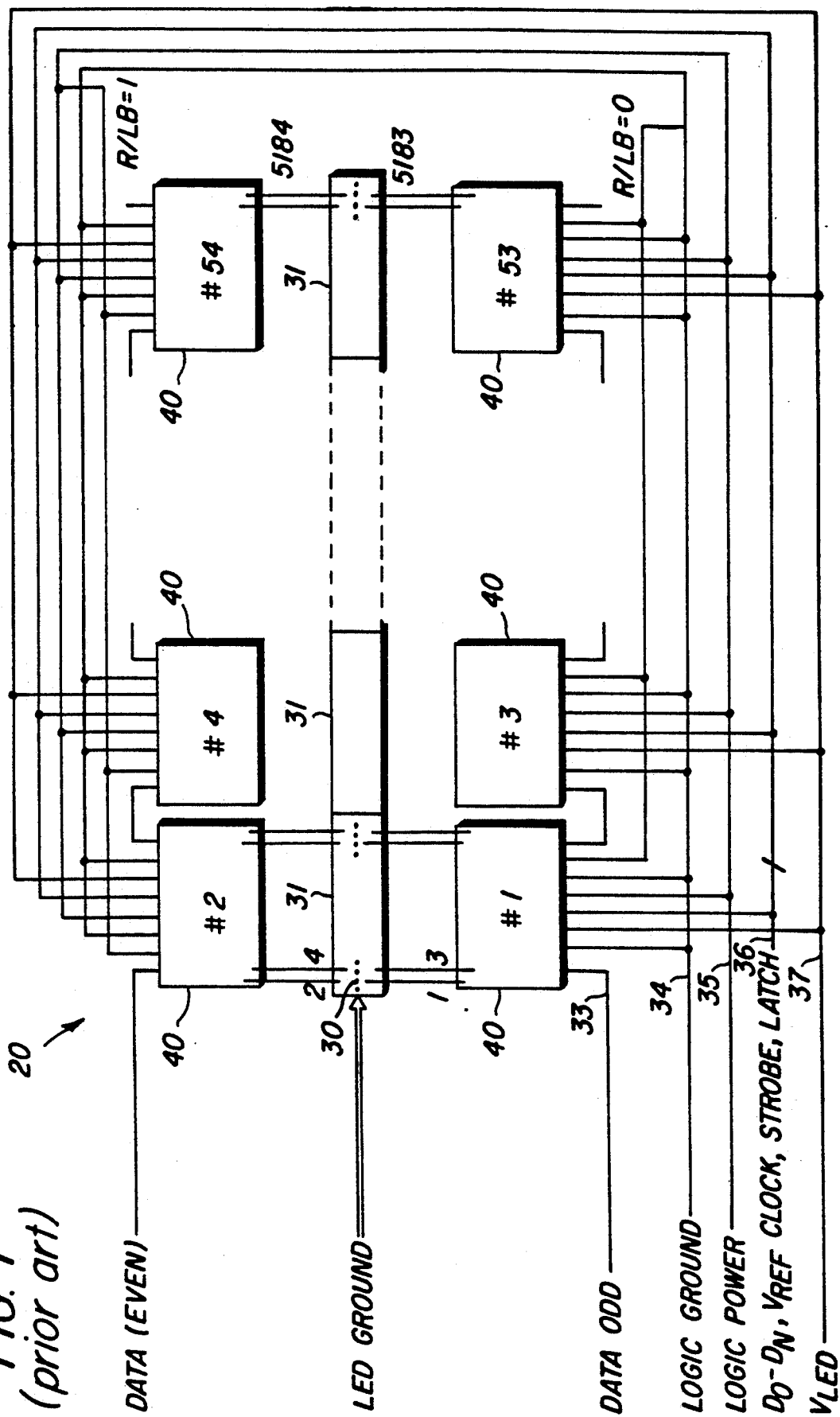
FIG. 1 is a schematic in block diagram form of a printhead in accordance with the prior art.
Figure 2:
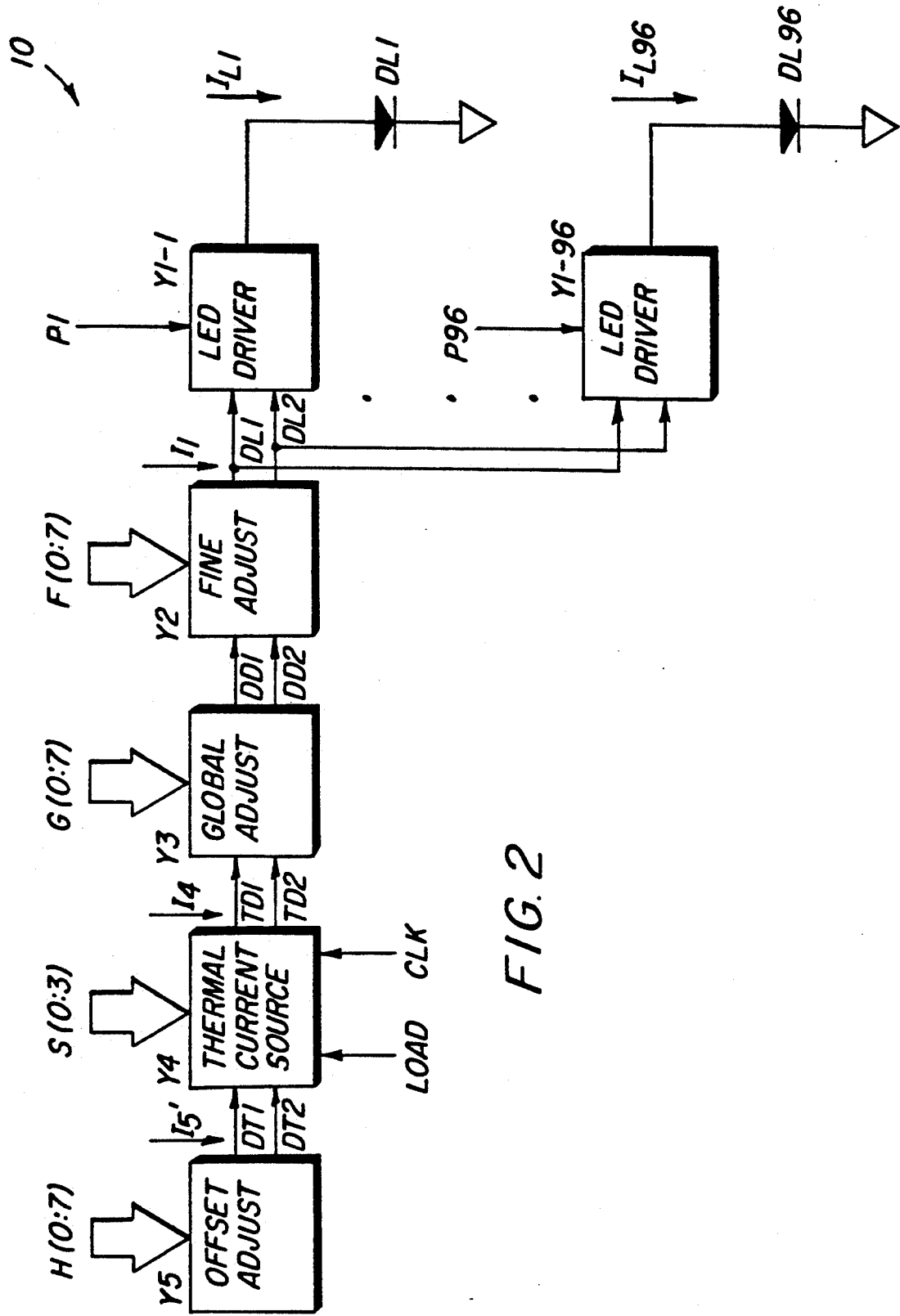
FIG. 2 is a schematic in block diagram form of a portion of a circuit used in a driver chip to which the invention pertains and which driver chip may be used on a printhead of the type illustrated in FIG. 1.

With reference to FIG. 2, a block diagram of a portion of an integrated circuit driver chip 10 that serves to control current to each of 96 LEDs served by that driver chip is illustrated. As noted above, also associated with such driver chip are image data handling circuitry for controlling the pulse durations of pixel recording periods. Circuitry for control of data is described in aforementioned U.S. Pat. No. 4,885,597 and aforementioned U.S. application Ser. No. 07/543,929. Circuitry for controlling pulse duration in a grey level printer is further described in U.S. Pat. No. 4,750,010 to Ayers et al and in U.S. application Ser. No. 07/290,002 filed in the names of Pham et al, the contents of which are also incorporated by this reference.

As noted above, the portion of such a driver circuit to which the invention pertains is that for controlling the amount of driving current to each of the LEDs once the LEDs have been switched on by logic circuitry controlled by the data handling circuit portions of the driver chip. The integrated circuit driver chip 10 illustrated can be divided into five functional building blocks, circuits Y1 through Y5, which cooperate to supply the desired forward currents (for example, 2 mA to 11 mA) to LEDs, DL1 through DL96, to generate proper operating electroluminescence. A special portion of the circuit Y4 is so designed as to respond directly to temperature changes in conformance with a desired thermal profile, while the rest of the system circuits function with negligible temperature coefficients. In the present embodiment, which employs silicon CMOS technology, a current is generated in circuit Y4 which varies linearly with temperature. The desired temperature dependency is achieved by a deliberate choice of circuit topology, wherein transistors are specially sized and biased so that operation in the weak-inversion (or subthreshold) region is achieved. This temperature dependency is then faithfully propagated throughout the remainder of the LED printhead driver system by the action of cascoded current mirrors. This temperature sensitive portion of the circuitry functions in a different manner from a conventional, localized temperature sensor, in that it is spatially distributed over an extended area of approximately 0.84 mm by 0.25 mm, and that the thermal current generated by it is directly amplified to produce the LED drive currents without the deployment of any intermediate feedback circuitry. In other words, the change in current with respect to temperature is automatic and requires no external sensors.

Unless otherwise stated, each transistor described in these circuits is biased to operate in the above-threshold saturation region, in which the following relationship is valid:

$$0 < V_{GS} - V_T < V_{DS} \qquad \text{(Eqn. 1.1)}$$

where $V_{GS}$, $V_T$ and $V_{DS}$ are the gate-to-source voltage, the threshold voltage, and the drain-to-source voltage of the transistor, respectively. First order approximation of the transfer characteristics of a MOSFET in the saturation region can be expressed by the following known model in which the drain-to-source current is described as a parabolic function of the gate-to-source voltage modulated by the drain-to-source voltage, namely:

$$I_{DS} = \mu_0 C_{ox}(W/L)(V_{GS} - V_T)^2(1 + \lambda V_{DS}) \qquad \text{(Eqn 1.2)}$$

where
- $\mu_0$ is the surface mobility of the channel for the transistor
- $C_{ox}$ is the gate oxide capacitance per unit area
- W/L is the effective channel width-to-length ratio and
- $\lambda$ is the channel length modulation parameter.

The following paragraphs provide a brief summary of the function and operation of each of the functional block circuits.

Figure 3A:
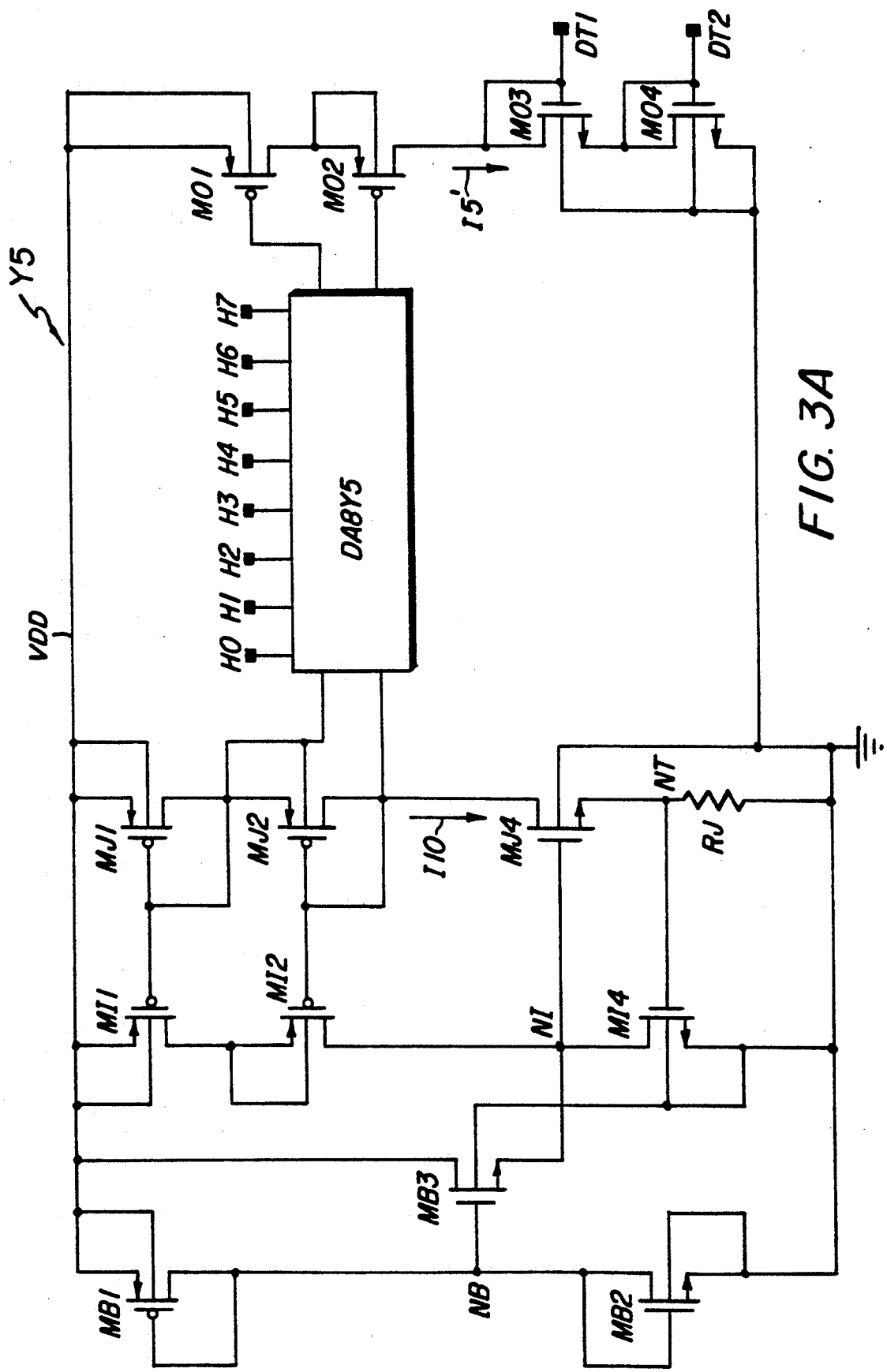

With reference to FIG. 3A, circuit Y5 serves as a programmable constant current source made up of a bootstrap (self-biasing) current reference circuit feeding into an 8-bit, multiplying digital-to-analog converter, DAC, (DA8Y). An externally supplied 8-bit digital word, H[0:7], regulates the output current $I_5'$ that is mirrored to circuit Y4 (FIG. 3B) and, along with another externally supplied digital word, S[0:3], is responsible for controlling the temperature coefficient of the current $I_4$ which is generated in circuit Y4 (FIG. 3B) and varies linearly with temperature. The 4-bit input word S[0:3] can be either preloaded by the logic and control unit with a fixed value by means of signal $\overline{\text{LOAD}}$ or set in the field by means of signal $\overline{\text{CLK}}$. The temperature coefficient may be digitally varied from 0.3% to 1% per degree Celsius.

The magnitude of the output current from circuit Y4, is subsequently amplified by circuits Y3 (FIG. 3C) and Y2 (FIG. 3D), both of which are fully cascoded, 8-bit current steering, multiplying DACs. An externally supplied 8-bit digital word, G[0:7], intended for global control, is used to set the same nominal current for all the printhead driver chips, each of which consists of 96 current driver channels; while another externally supplied 8-bit digital word, F[0:7], intended for fine control, is used to adjust the LED currents on each individual driver chip so that uniformity in LED luminescence can be attained throughout the entire printhead. The combined application of G[0:7] and F[0:7] results in an effective 16-bit resolution of LED drive current adjustment capability. In this regard, reference to U.S. Pat. No. 4,885,597 is made. All the 8-bit DACs used in circuits Y2, Y3 and Y5 are constructed such that all the current mirroring devices responding to each input data bit are laid out in respective exact multiples of a unit cell transistor and arranged in a common centroid configuration. As a consequence of this strategic segmentation and placement of critical transistors, the transfer characteristics of each of the 8-bit DACs is highly linear. The combination of this layout technique along with the fully cascoded current-mirror circuit topology allows the temperature profile obtained in circuit Y4 to faithfully propagate throughout the ensuing stages of the printhead driver system.

Circuit Y1 (FIG. 3E) is a high-impedance, linear current amplifier/driver that boosts the output current $I_1$ generated from circuit Y2 (which falls within the range up to about 200 microamperes) to that required for normal LED electroluminescence operation (which is typically on the order of a few milliamperes). The light output from the xth LED is switched by bit Px, where x=1, ..., 96 in accordance with a scheme using pulsewidth modulation to provide gray-scale printing operation in accordance with techniques more fully described in the prior art noted above. In this circuit, a separate power supply, $V_{LED}$, is used to minimize noise emanating from the switching of the LEDs. The use of the cascoded current mirror configuration provides very high insensitivity to power supply fluctuations, significant reduction in silicon die real-estate, extended region of linear current amplification operation, and excellent current regulation in response to wide excursions of LED loading conditions.

Thermal Offset Current Adjust Circuit (Circuit Y5)

FIG. 3A shows the schematic diagram of the thermal offset current adjust circuit Y5. Its function is to provide a current, $I_5'$, to be mirrored to the following linear thermal current source circuit Y4 for effecting the adjustability of the latter's output current temperature coefficient. This is achieved by means of subcircuit DA8Y5, an 8-bit current-steering multiplying digital-to-analog converter (DAC) which multiplies a digital word, H[0:7], with an input current, $I_{10}$, that is reflected from a preceding bootstrap current reference subcircuit to yield an output current, $I_5$. Circuit DA8Y5, as described in further detail below, is designed to operate with an input current range centering around 5 μA and an output current range also centering around 5 μA when the digital word input H[0:7] is set to midrange, i.e., 80(hex). Transistors MO1 through MO4 form a current-matching buffer for interfacing DA8Y5 with the following stage Y4. All the transistors in this circuit are biased to operate in the saturation region. Detailed discussion of the operation of the circuit is described in the following paragraphs.

Transistors MJ1 and MJ2 are the cascoded master current-mirror pair driving the DAC subcircuit DA8Y5. These two transistors in conjunction with transistors MI1, MI2, MJ4 and MI4, and resistor $R_J$ are connected in a negative feedback configuration, in which node NT is caused to equilibrate at a voltage value, $V_{NT}$. Accordingly, a stable current of value $I_{10}$ of about 27 μA is generated where $R_J$=50K ohms and MI4 is a n-channel MOSFET fabricated with a 1.6 μm N-well CMOS double-metal, single-poly process with a gatewidth-to-length ratio of 2.

The digitally-controlled output current from sub-circuit DA8Y5 is reflected to the slave cascoded current-mirror pair transistors MO1 and MO2 to yield the output current $I_5'$. It may be noted that each pair of cascoded transistors described herein have their respective gate electrodes coupled to the gates of corresponding transistors of another cascode pair to which they are connected in a current mirror relationship. $I_5'$ is in turn mirrored to the following linear thermal current source circuit Y4 by means of diode-connected transistors MO3 and MO4 through the voltages developed at nodes DT1 and DT2. As a result, $I_5'$ and $I_5$ (FIG. 3B) are linearly proportional to $I_{10}$ with the proportionality constant being determined by the input digital word H[0:7]. Mathematically:

$$I_5 = I_{10} \sum_{k=0}^{7} 2^k H_k$$

where $H_k$ is the digital weight of the input word H[0:7]. The current $I_5'$ is the same level as that of $I_5$ but this 1:1 mirrored relationship is not critical.

Figure 3B:
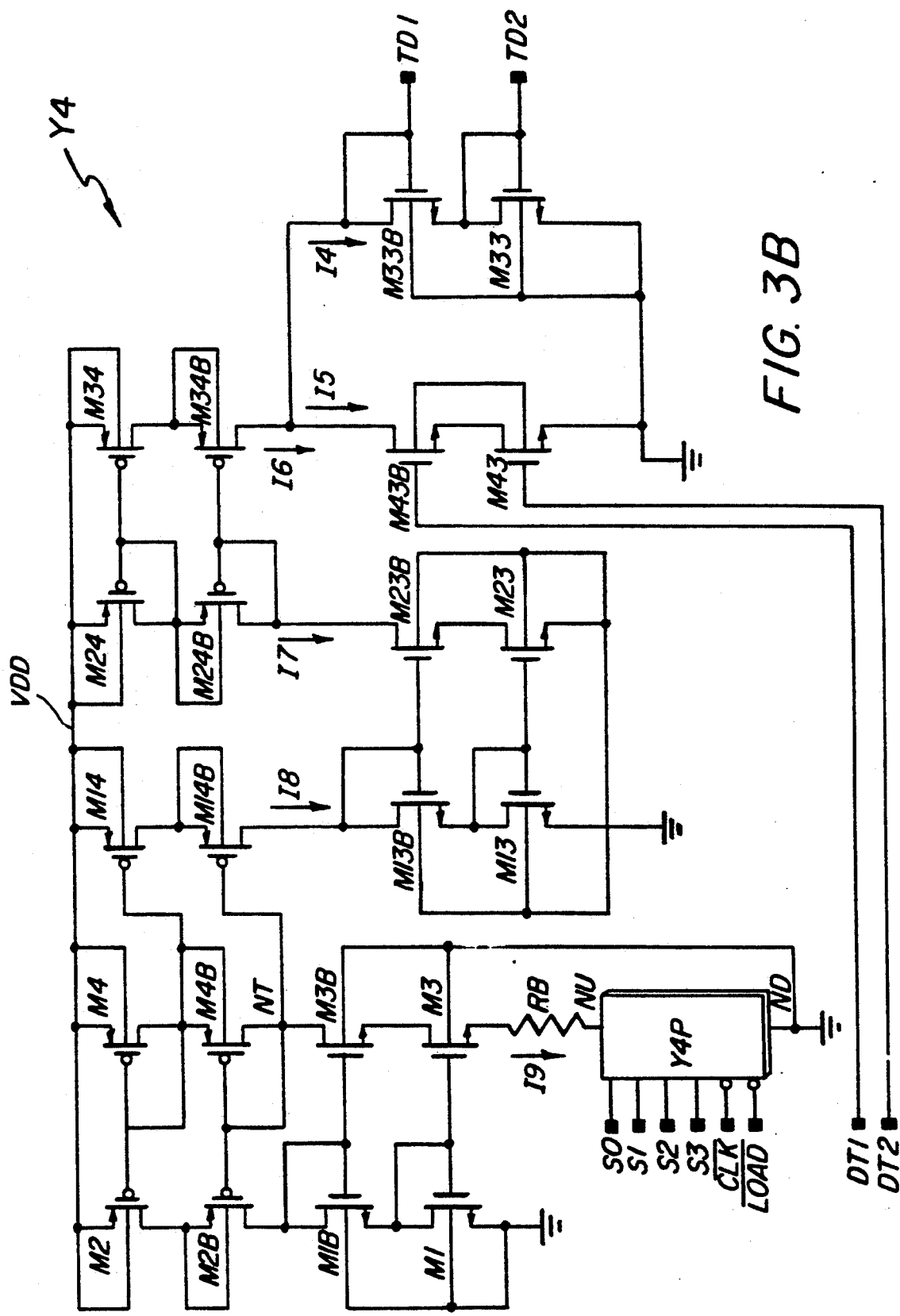

Linear Thermal Current Source Circuit Y4 With Programmable Temperature Coefficient FIG. 3B shows the schematic diagram of the Linear Thermal Current Source Circuit Y4 with programmable temperature coefficient control capability. Its function is to generate a variable output current, $I_4$, that exhibits a linearly (straight line) increasing dependency on temperature, upon which the thermal characteristics of the entire analog driver system is derived. The desired temperature dependency is achieved by biasing and sizing a portion of the circuit in the weak-inversion (or subthreshold) saturated region, and this dependency then propagates throughout the rest of the printhead driver circuit by the action of the current mirrors. The temperature derivative of the output current, $dI_4/dT$, is determined by means of the Temperature Slope Adjust Circuit, Y4P, while the temperature coefficient, defined as:

$$\theta_4 = \frac{1}{I_4} \times \frac{dI_4}{dT}\bigg|_{T=T_0}$$

referenced to temperature $T_0$ can be adjusted by varying an offset current, $I_5$, which is mirrored from the preceding Thermal Offset Current Adjust Circuit Y5. The output current $I_4$ is subsequently amplified through three following stages: an eight-bit Global-Adjust Current Control Circuit, Y3, an eight-Bit Fine-Adjust Current Control Circuit, Y2, and finally a Linear Cascoded LED Current Amplifier/Driver Circuit, Y1, to provide optimal drive currents for 96 channels of LEDs in each printhead driver chip. Detailed discussion of the operation of the circuit Y4 is described in the following paragraphs.

The characteristic temperature dependency of the driver chip is principally derived from the major subcircuit comprising transistors M1, M1B, M2, M2B, M3, M3B, M4, and M4B in conjunction with resistor $R_B$ and subcircuit Y4P. All the transistors in this major subcircuit are designed to operate in the subthreshold saturation region such that the conditions:

$$V_G - V_S < V_T \quad \text{(Eqn. 2.1)}$$

and $$|V_D - V_S| > 3U_T \quad \text{(Eqn. 2.2)}$$

are valid, and the MOSFET transfer characteristics follow the exponential relationship:

$$I_D \approx (W/L)I_0 \exp\{V_G/\eta U_T\} \exp\{V_S/U_T\} \quad \text{(Eqn. 2.3)}$$

where
- $I_D$ is the drain current;
- $V_G$ is the gate-to-substrate voltage;
- $V_S$ is the source-to-substrate voltage;
- $V_D$ is the drain-to-substrate voltage;
- $V_T$ is the threshold voltage;
- $W/L$ is the width-to-length ratio of the transistor;
- $I_0$ is a process-dependent parameter (in Amperes);
- $\eta$ is the slope parameter for the weak inversion region (typically 1.4–1.8);
- $U_T$ is the thermal voltage ($=kT/q$);
- $k$ is Boltzmann's constant;
- T is the absolute temperature, in °K. (degrees Kelvin); and
- q is the electronic charge.

The components in the major subcircuit are connected in a negative feedback configuration (as shown in FIG. 3B), which cause the node NT to stabilize toward the voltage $$V_R = U_T \gamma$$

where $$\gamma = \log\left\{\frac{\left(\frac{W}{L}\right)_{M2}\left(\frac{W}{L}\right)_{M3}}{\left(\frac{W}{L}\right)_{M1}\left(\frac{W}{L}\right)_{M4}}\right\}$$

is a constant dependent only on the sizings of the transistors.

If $R_T$ represents the sum of $R_B$ and the resistance value $R_P$ generated by the Temperature Slope Adjust Circuit, Y4P, then the current $I_9$ flowing through $R_T$ is given by:

$$V_R/R_T = U_T\gamma/R_T$$

which can be rewritten to expressly indicate the temperature dependency as follows:

$$I_9 = \alpha T/R_T$$

where $\alpha$ is a temperature independent constant:

$$\alpha = k\gamma/q \quad \text{(Eqn. 2.4)}$$

The temperature coefficient of $I_9$, $\theta_9$, referenced to temperature $T_0$ is then given by:

$$\theta_9 = \frac{1}{I_9}\left(\frac{dI_9}{dT}\right)\bigg|_{T=T_0} = \left(\frac{R_T}{\alpha T}\right)\frac{d}{dT}\left(\frac{\alpha T}{R_T}\right)\bigg|_{T=T_0} \quad \text{Eqn 2.5}$$

Substituting Eqn. 2.4 into the above equation, and noting that both $\eta$ and $\gamma$ have negligible temperature dependencies on T, Eqn. 2.5 can be evaluated to yield:

$$\theta_9 = \frac{1}{T_0} - \frac{1}{R_T}\frac{dR_T}{dT}\bigg|_{T=T_0} \quad \text{Eqn 2.6}$$

Now, resistance can be modeled to first order as:

$$R_T = R_{T0}\{1 + \kappa(T - T_o)\} \quad \text{Eqn. 2.7}$$

where $\kappa$ is the temperature coefficient of the resistance $R_T$ in units of %/°K. (or, equivalently, °C.), and $R_{T0}$ is the resistance value at temperature, $T_0$.

By virtue of Eqn. 2.7, the expression for the temperature coefficient of $I_9$ from Eqn. 2.6 can be simplified to give:

$$\theta_9 = 1/T_0 - \kappa$$

At $T_0 = 300°$ K., $1/T_0 \sim 0.33\%/°K$. For polysilicon resistors, $\kappa$ is approximately 0.08%/°K. This gives the temperature coefficient of $I_9$ to be approximately 0.25%/°K. The following paragraphs describe how a variable temperature coefficient can be obtained by means of additional circuitry.

The thermally dependent current $I_9$ from the master cascoded transistor pairs M4 and M4B is mirrored to the slave cascoded transistor pairs M14 and M14B to give current $I_8$. As indicated above, all of the transistors in the above-mentioned major subcircuit operate in the subthreshold saturation region, whose transfer characteristics are governed by Eqn. 2.1, Eqn. 2.2 and Eqn. 2.3. Operation is converted back to the normal (above-threshold) saturation region, as described in Eqn. 1.1 and Eqn. 1.2, by the appropriate sizing of transistors M13 and M13B. After two subsequent cascoded current mirror actions employing one set of transistors consisting of M13, M13B, M23, and M23B, and another set consisting of M24, M24B, M34, and M34B, all operating in the normal saturation region, a resultant current, $I_6$, flowing through transistors M34 and M34B is obtained. Since the action of current mirroring is essentially a multiplicative process, $I_6$ is by corollary also a linear function of temperature and can, therefore, be given by:

$$I_6 = \beta T/R_T$$

where $\beta$ is a temperature independent parameter:

$$\beta = \alpha \frac{\left(\frac{W}{L}\right)_{M34}\left(\frac{W}{L}\right)_{M23}\left(\frac{W}{L}\right)_{M14}}{\left(\frac{W}{L}\right)_{M24}\left(\frac{W}{L}\right)_{M13}\left(\frac{W}{L}\right)_{M4}}$$

It can be shown that the temperature contribution from transistors operating in the cascoded current-mirror configuration is negligible. Thus, the temperature derivative of $I_6$ can be similarly given as:

$$I_6 = I_{60}[1 + \theta_6(T - T_0)], \quad \text{Eqn. 2.8}$$

with its temperature coefficient defined as:

$$\theta_6 = \frac{1}{I_{60}} \times \left(\frac{dI_6}{dT}\right)\bigg|_{T=T_0} = \frac{1}{T_0} - \kappa$$

where $I_{60}$ is the value of $I_6$ at reference temperature, $T_0$, namely:

$$I_{60} = \frac{\beta T_0}{R_{T0}}$$

For $\kappa = 0.08\%/°K$, it can be readily calculated that $\theta_6 \approx 0.25\%/°K$ at $T_0 = 300°$ K., same as for $\theta_9$.

A branch consisting of transistors M43 and M43B is inserted into the circuit so that the offset current $I_5$ is subtracted from $I_6$ to yield the output current $I_4$ flowing through transistors M33 and M33B. $I_5$ is mirrored from the preceding Thermal Offset Current Adjust Circuit Y5 (FIG. 3A) through the voltages developed at nodes DT1 and DT2. Hence, the output current $I_4$ can be written as:

$$I_4 = I_6 - I_5 = \beta T/R_T - I_5.$$

Substituting Eqn. 2.8 for $I_6$ and for $I_5$, $I_5 = I_{50}[1 + \theta_5(T - T_0)]$, which equation approximates the thermal behavior of $I_5$ to first order and where $I_{50}$ is the value of $I_5$ at T and $\theta_5$ is the temperature coefficient of $I_5$ with respect to reference temperature $T_0$ or:

$$\theta_5 = \frac{1}{I_5}\left(\frac{dI_5}{dT}\right)\bigg|_{T=T_0}$$

and thus yields $I_4 = I_{40}[1 + \theta_4(T - T_0)]$ where $I_{40}$ is the value of $I_4$ at temperature $T_0$: $I_{40} = I_{60} - I_{50}$, and $\theta_4$ is the temperature coefficient of $I_4$:

$$\theta_4 = \theta_6 \left[ \frac{1 + \left(\frac{I_{50}}{I_{60}}\right)\left|\frac{\theta_5}{\theta_6}\right|}{1 - \left(\frac{I_{50}}{I_{60}}\right)} \right],$$

which explicitly shows the deviation of the value of the temperature coefficient of $I_4$ from $\theta_6$ as a consequence of introducing the offset current $I_5$, and where use has been made of the fact that $\theta_5 < 0$. It is evident from this equation that $\theta_4$ can attain values larger than $\theta_6$ by ensuring that $I_{50} < I_{60}$. In a preferred embodiment, $\theta_6 \approx 0.25\%/°K$ and $|\theta_5| \approx 0.1\%/°K$. In this case, one obtains, numerically, $$\theta_4 \approx 0.25 \left[ \frac{1 + 0.4\left(\frac{I_{50}}{I_{60}}\right)}{1 - \left(\frac{I_{50}}{I_{60}}\right)} \right] \%/°K. \quad \text{Eqn. 2.9}$$

If the offset current from circuit Y5 is programmed so that $I_{60} = 2I_{50}$, then one obtains the value of $\theta_4 \approx 0.6\%/°K$.

The temperature coefficient for $I_4$ can also be shown as:

$$\theta_4 = \frac{1}{T_0}\left(1 - \kappa T_0\right) \left\{ \frac{1 + \left(\frac{R_{T0}I_{50}}{\beta T_0}\right)\left[\frac{\kappa T_0\left(1 + \sqrt{\frac{\Gamma_0}{2 + \Gamma_0}}\right)}{1 - \kappa T_0}\right]}{1 - \left(\frac{R_{T0}I_{50}}{\beta T_0}\right)} \right\}.$$

where $\Gamma_0 = L/(\mu_n C_{ox} W R_{J0} V_T)$.
where
$V_T$ is the threshold voltage of transistor MI4;
W/L is the channel width-to-length ratio of transistor MI4;
$\mu_n$ is the n-channel electron surface mobility; and
$C_{ox}$ is the gate oxide capacitance per unit area.
Note that the quantity, $$\kappa = \frac{1}{R_T}\left(\frac{dR_T}{dT}\right)\bigg|_{T=T_0}$$

is the temperature coefficient of resistor $R_T$.

In summary, circuit Y4 produces an output current, $I_4$, which increases linearly, i.e., along a straight line, with temperature, and whose temperature coefficient can be adjusted by varying $R_{T0}$ and $I_{50}$. In practice, $R_{T0}$ is chosen to be in such a range that allows transistors M1 through M4B to stay within the subthreshold saturation region, and $I_{50}$ is then restricted to vary in value so that:

$$I_{50} < \beta T_0/R_{T0} = I_{60}.$$

Temperature Slope Adjust Circuit Y4P

Figure 3D:
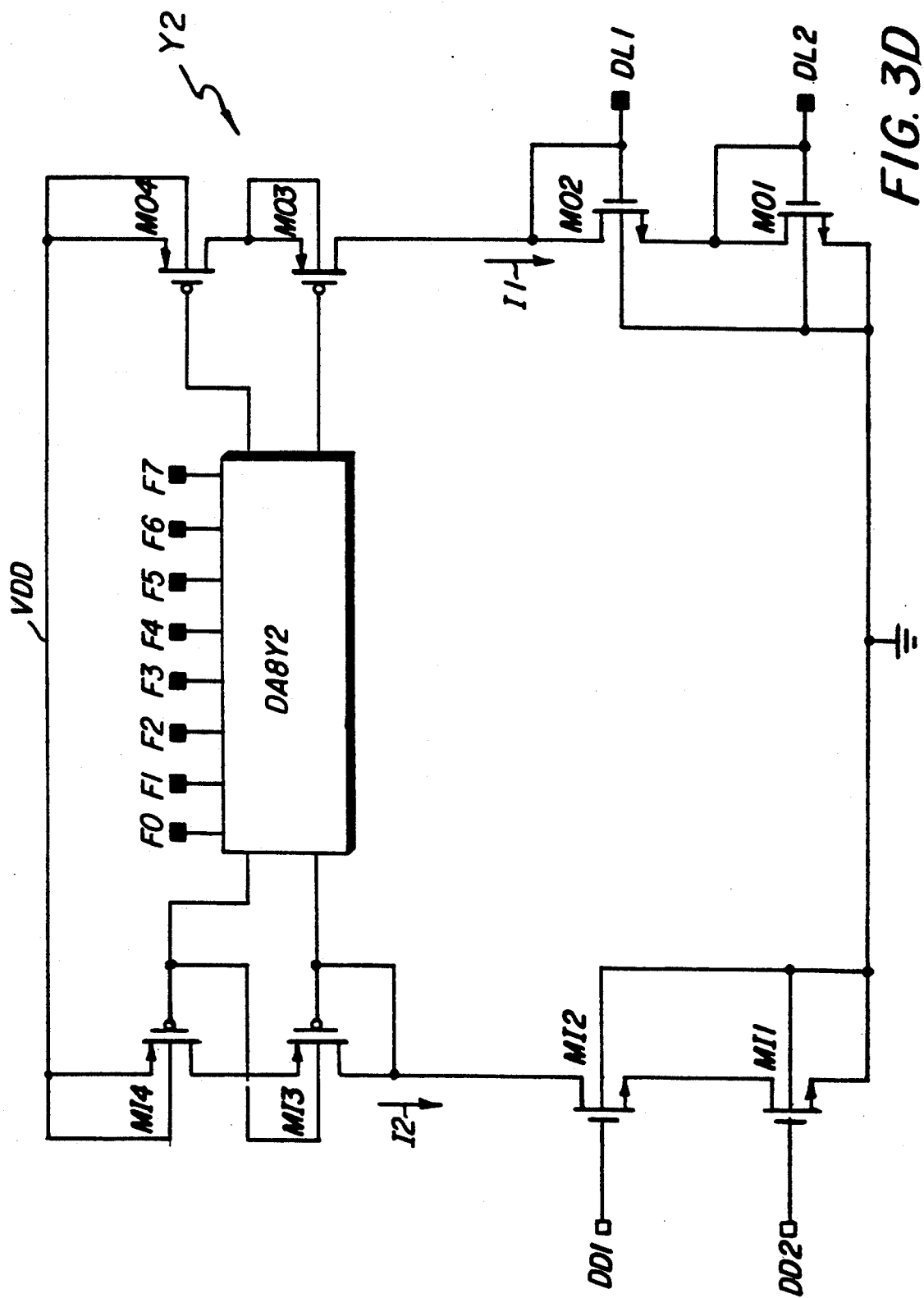
Figure 3E:
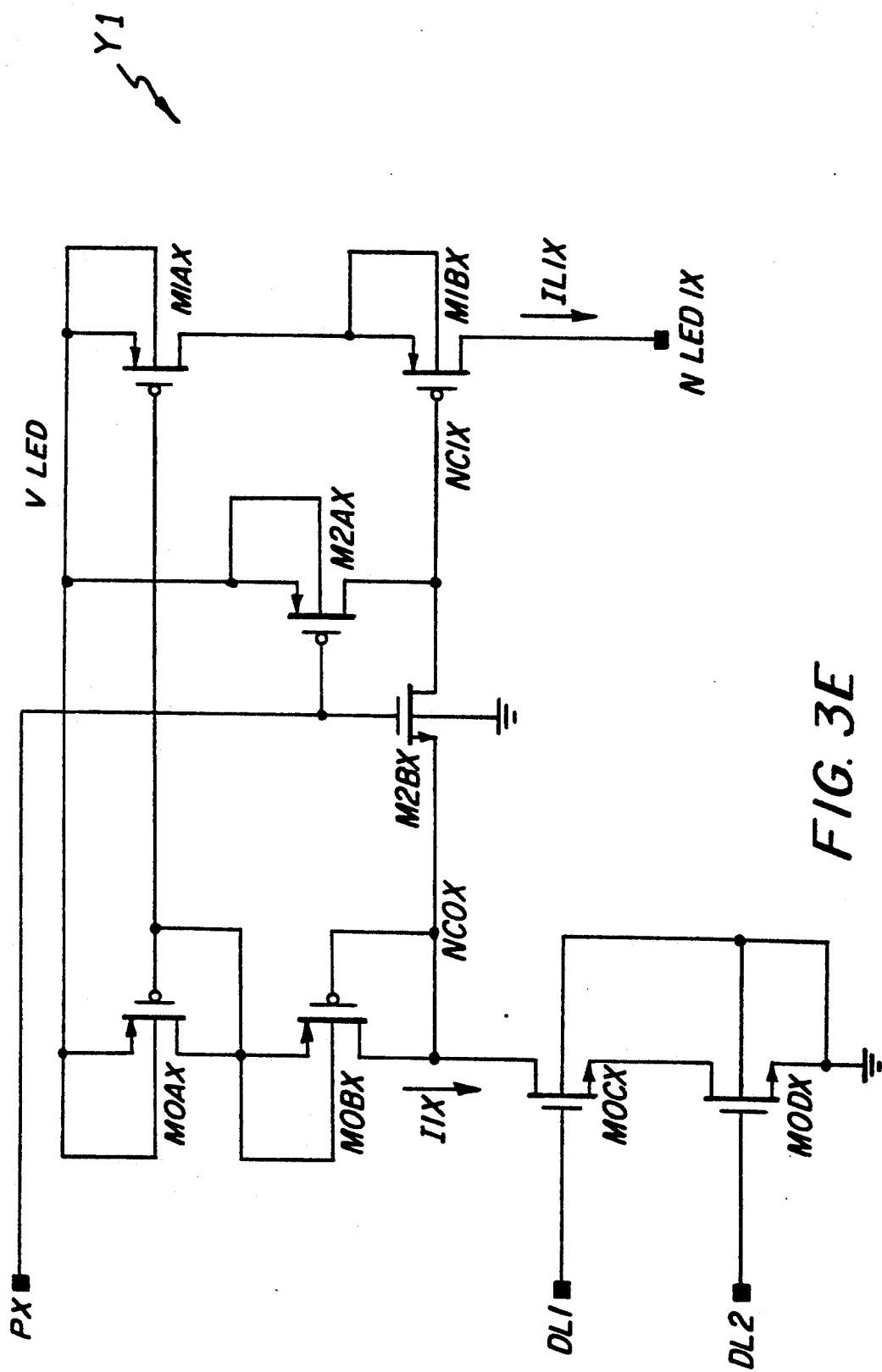
Figure 3F:
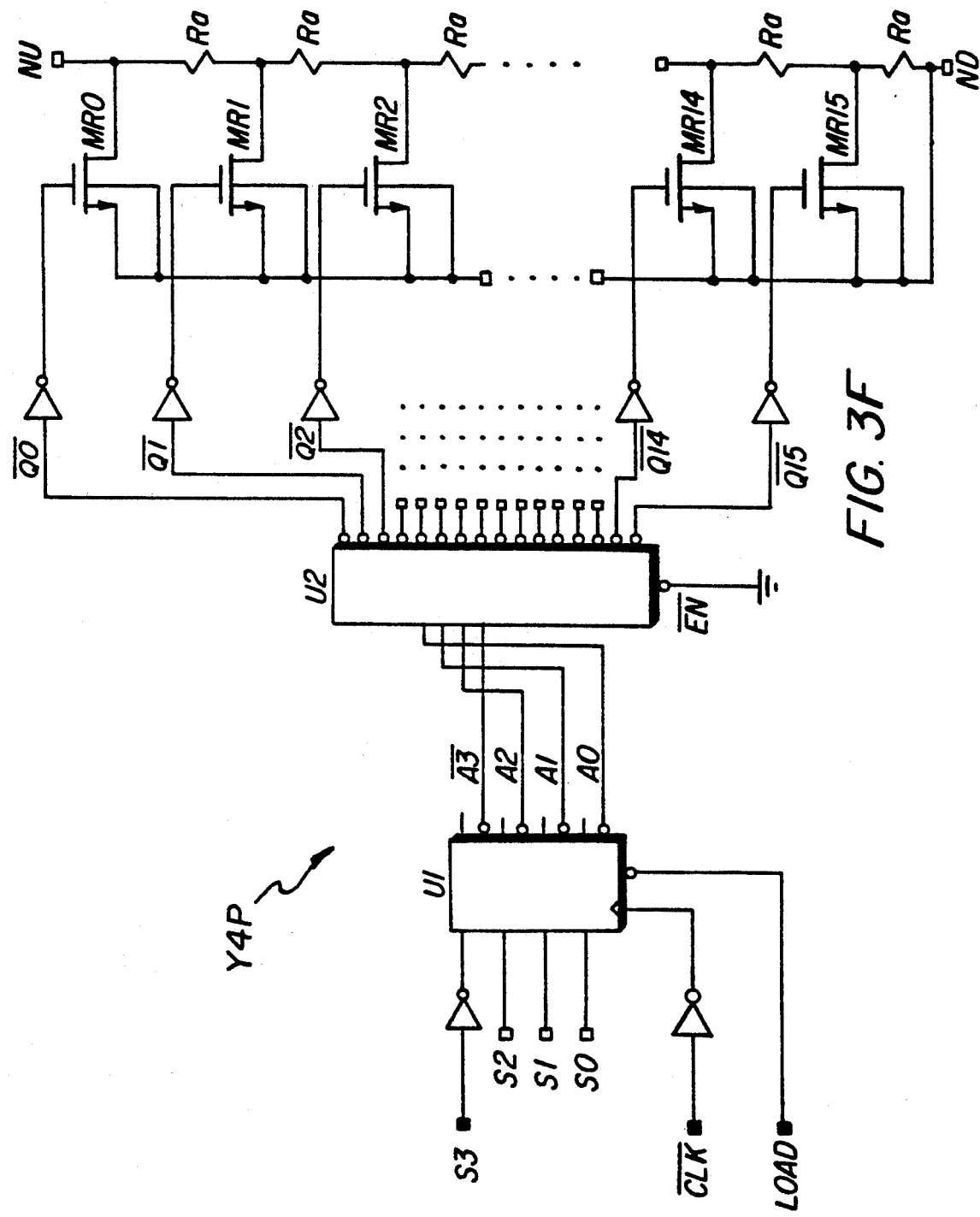

The schematic diagram of the Temperature Slope Adjust subcircuit Y4P is shown in FIG. 3F. This circuit serves as a four-bit digital potentiometer for the purpose of providing a variable resistance, $R_T$, the function of which is to adjust the thermal current $I_9$ for optimal operation of the parent Linear Thermal Current Source Circuit Y4. As shown above, the relationship between $I_9$ and $R_T$ is given by:

$$I_9 = \alpha T/R_T = \alpha T/(R_B + R_P). \quad \text{Eqn. 3.0}$$

$R_T$ consists of two components: a fixed component, $R_B$, and a variable component, $R_P$. Both $R_B$ and $R_P$ may be implemented using polysilicon. Tunability of $R_T$ is highly desirable because precision resistance values using polysilicon cannot be readily achieved using currently available CMOS processes due to limitations in impurities-doping and photolithographic controls resulting in process variations over different wafer runs. The variable component of the resistance $R_P$ appearing between terminals NU and ND is determined by an externally supplied digital word, S[0:3], from the logic and control unit, and is so selected that transistors M1 through M4B operate well within the subthreshold saturation region, where the above expression for the temperature dependency is valid. Detailed discussion of the operation for the circuit is described in the following paragraphs.

The four-bit potentiometer represented by subcircuit Y4P is made up of a resistor chain consisting of sixteen serially connected identical resistor segments, $R_a$, and terminating at nodes NU and ND. A 4-to-16 decoder, U2, is then used to select which one, and only one, of the 16 segments of the chain is to be shorted to node ND via by-pass transistors MR0 through MR15. An externally supplied, four-bit digital word, S[0:3], can either be preloaded to latch U1 upon power-up by setting the e,ovs/load/ input signal low or clocked in at any specific time at the falling edge of the $\overline{CLK}$ signal.

From the schematic shown in FIG. 3F, it is straight forward to see that:

$$R_P = nR_a, \qquad \text{(Eqn. 3.1)}$$

when by-pass transistor MRn (n=1, ..., 15) is activated by the output of the decoder U2. All the by-pass transistors are sized such that their on-resistances are very small compared to $R_a$. Meanwhile, the combined transfer characteristics of latch U1 and decoder U2 can be expressed as:

$$n = \sum_{i=0}^{3} S_i 2^i \qquad \text{(Eqn. 3.2)}$$

where n is the output channel index from U2, and $S_i$ is the binary weight of the input word S[0:3].

By combining Eqn. 3.1 and Eqn. 3.2, the variable resistance component, $R_P$ can be expressed by the following equation, appropriate for a four-bit digital potentiometer:

$$R_p = R_a \sum_{i=0}^{3} S_i 2^i \qquad \text{Eqn. 3.3}$$

Substituting Eqn. 3.3 into Eqn. 3.0, the thermal current $I_9$ assumes the form:

$$I_9 = \frac{\alpha}{R_B + R_a \sum_{i=0}^{3} S_i 2^i} T. \qquad \text{Eqn. 3.4}$$

Typical currents when S[0:3] is set to 3 (decimal) are $I_9 \approx 0.7\ \mu A$, and $I_4 \approx 1.8\ \mu A$.

Eight Bit Global-Adjust Current Control Circuit Y3

FIG. 3C shows the schematic diagram of the Eight-Bit Global-Adjust Current Control Circuit Y3. It is, functionally speaking, a current-controlled current-source with digitally programmable gain. Its purpose is to provide a variable output current, $I_{2'}$, that is mirrored to the following Eight-Bit Fine-Adjust Current Control Circuit Y2. With this current, circuit Y2 generates a fine-adjust control current, $I_1$, which is subsequently fed into the following Liner Cascoded LED Current Amplifier/Driver Circuit Y1 to be described below. This function is achieved by means of an Eight-Bit Current-Steering Multiplying Digital-to-Analog Converter subcircuit, DA8Y3, which multiplies an input current, $I_3$, obtained by mirroring the output thermal current $I_4$ of the preceding Linear Thermal Current Source Circuit Y4 with an externally supplied eight-bit digital word, G[0:7], to produce a global-adjust control current, $I_2$. Detailed operation of circuit DA8Y is described below. The value of G[0:7] is set to be the same for all the printhead driver chips, each of which consists of 96 channels of LEDs. The purpose of G[0:7] is to place each driver chip in the same nominal operation condition. Transistors MI1 through MI4 together form a current-matching buffer for interfacing DA8Y3 with the preceding stage Y4; while transistors MO1 through MO4 form the counterpart for interfacing DA8Y3 with the following stage Y2. Detailed discussion of the operation of the circuit is described in the following paragraphs.

Transistors MI1 and MI2 determine the value of the input current $I_3$ in response to the gate voltages developed at nodes TD1 and TD2 by the action of cascoded current-mirroring with the preceding stage Y4. $I_3$ is then used to drive the inputs of circuit DA8Y3 by means of the master cascoded current-mirror input pair MI3 and MI4. The resultant digitally-controlled output current from circuit DA8Y3 is reflected to the slave cascoded current-mirror transistors MO3 and MO4 to produce the output current $I_{2'}$. This global-adjust control current $I_{2'}$ is in turn mirrored to the following Eight-Bit Fine-Adjust Current Control Circuit Y2 by means of diode-connected transistors MO1 and MO2 through the voltages developed at nodes DD1 and DD2. Accordingly, $I_{2'}$ is linearly proportional to $I_3$ by virtue of current-mirror action, with the proportionality constant being determined by the externally supplied digital word G[0:7]. The result can be summarized mathematically as follows:

$$I_2 = I_3 \sum_{j=0}^{7} 2^j G_j$$

where $G_j$ is the digital weight of the input word G[0:7].

In accordance with the transistor sizing information given in FIGS. 4A, 4B, $I_3$ may be maintained at 5 $\mu A$ and with the digital word set at mid-range, i.e., G[0:7] = 128 (decimal), the output current $I_{2'}$ is the same as the input current $I_3 = 5\ \mu A$.

Eight-Bit Fine-Adjust Current Control Circuit Y2

FIG. 3D shows the schematic diagram of the Eight-Bit Fine-Adjust Current Control Circuit. It is, functionally speaking, a current-controlled current-source with digitally programmable gain. Its purpose is to provide a variable output current, $I_1$, that is mirrored to the following Linear Cascoded LED Current Amplifier/Driver Circuit Y1 to accurately control the drive currents $I_{Lx}$ (x=1, ..., 96) for the 96 LED current driver channels on board each printhead driver chip, as will be discussed below. This function is achieved by means of an Eight-Bit Current-Steering Multiplying Digital-to-Analog Converter subcircuit, DA8Y2, which multiplies an input global-adjust control current, $I_2$, derived by the preceding Eight-Bit Global-Adjust Current Control Circuit Y3 with an externally supplied from the logic and control unit eight-bit digital word, F[0:7], to produce a fine-adjust control current, $I_1$. Detailed operation of circuit DA8Y2 will be described below. In contrast to that of G[0:7] as discussed above, the value of F[0:7] typically varies for each individual printhead driver chip in order to compensate for fabrication process variations. While the action of G[0:7] is to endow all the driver chips with the same nominal operation currents, the purpose of F[0:7] is to fine-tune the LED currents on each individual ASIC so that uniformity in LED luminescence can be attained throughout the entire printhead. Transistors MI1 through MI4 together form a current-matching buffer for interfacing DA8Y2 with the preceding stage Y3; while transistors MO1 through MO4 form the counterpart for interfacing DA8Y2 with the following stage Y1. Detailed discussion of the operation of the circuit will now be described.

Transistors MI1 and MI2 determine the value of the input current $I_2$ in response to the gate voltages developed at nodes DD1 and DD2 by the action of cascoded current-mirroring with the preceding stage Y3. This current is then used to drive the inputs of DA8Y2 by means of the master cascoded current-mirror input pair MI3 and MI4. The resultant, digitally-controlled output current from circuit DA8Y2 is reflected to the slave cascoded current-mirror transistors MO3 and MO4 to produce the output current $I_1$. This fine-adjust control current $I_1$ is in turn mirrored to the following Linear Cascoded LED Current Amplifier/Driver Circuit Y1 by means of diode-connected transistors MO1 and MO2 through the voltages developed at nodes DL1 and DL2. Accordingly, $I_1$ is linearly proportional to $I_2$ by virtue of current-mirror action, with the proportionality constant being determined by the externally supplied digital word F[0:7]. The result can be summarized mathematically as follows:

$$I_1 = \sum_{i=0}^{7} 2^i F_i$$

where $F_1$ is the digital weight of the input word F[0:7].

With the transistor sizing information given in FIGS. 4A, 4B, typical exemplary values for $I_2$ are 5 μA and $I_1 = 72$ μA, F[0:7] set at 162 (decimal).

Linear Cascoded LED Current Amplifier/Driver Circuit Y1

FIG. 3E shows the schematic diagram of one of the 96 linear cascoded LED current amplifier/driver circuits on board of each one of the printhead driver chips. It is, functionally speaking, a high-impedance, linear, constant-current source that is insensitive to power supply fluctuations. Its purpose is to provide to the xth LED (where x = 1,2, . . . ,96) attached between node NLEDx and ground, a drive current, $I_{L1X}$, that varies monotonically with a master control current, $I_{LX}$. $I_{1X}$ is the mirrored counterpart of, and is numerically equal to, the fine-adjust control current $I_1$ generated from the preceding 8-bit fine-adjust current control circuit Y2, as discussed above. Transistors MOAx and MOBx form the master cascoded current-mirror pair, while transistors M1Ax and M1Bx form the slave cascoded current-mirror pair, and transistors, M2Ax and M2Bx form the LED current on/off switch controlled by a digital input bit, Px. Detailed discussion of the operation of the circuit is described in the following paragraphs.

Transistors MOCx and MODx determine the master control current $I_{1x}$ on the input leg of the circuit in response to the gate voltages developed at nodes DL1 and DL2 by the action of current mirroring with the preceding circuit Y2. Transistors M2Ax and M2Bx together constitute a STDP (single-throw-double-pole) switch responding to the state of the digital input bit, Px. When Px is set low, conduction through transistor M1Bx is cut off, because $(V_{GS})_{M1Bx} < 0$, thereby allowing no current to flow into the LED. When Px is set high, nodes NC0x and NC1x are connected together, enabling the action of current mirroring to be established between the master and slave-cascoded transistors pairs MOAx and MOBx, and M1Ax and M1Bx, respectively. This causes the LED drive current, $I_{L1X}$, in the slave leg to be linearly proportional to the master control current, $I_{1x}$, when all four transistors are maintained in the saturation region. The input-to-output magnification factor is equal to the ratio of the W/L value of MOAx to that of M1Ax, to first order, namely:

$$I_{L1X} = I_{1x} \frac{\left(\frac{W}{L}\right)_{M1Ax}}{\left(\frac{W}{L}\right)_{M0Ax}}.$$

It is important to note that since each LED channel driver has its own independent master current mirror section instead of sharing a common one, the switching of the yth LED channel by digital input bit Py will not affect the loading condition presented to the master cascoded current-mirror transistor, MOBx, of the xth channel. Therefore, cross-talk amongst the LED channels are greatly minimized, leading to very stable LED drive current in each channel. Another benefit is that during switching, the LED rise and fall times do not suffer regardless of how many other LED channels are turned on at one time due to the fact that one master is responsible for driving only one slave at all times. Since the sizes of transistors MOAx, MOBx, MOCx and MODx in the master control section are much smaller than those of the slave driver transistors, M1Ax and M1Bx, the added area to implement this is almost negligible. In order to provide a nominal current of 4 mA flowing through the LED when it is turned on at 30° C., the master control current, $I_{1x}$, is set to approximately 72 μA. The deployment of the cascoded current mirror configuration greatly reduces the effects of channel-length modulation (i.e., the sensitivity of $I_{DS}$ with respect to $V_{DS}$) on the drive transistors (M1Ax, M1Bx) operating in the saturation region. Typically, M1A and M1B may be of identical sizes, and have a dc-gain, $A_v$, that is much greater than unity.

The cascoded driver circuit offers an increase in output impedance over that of a single-transistor driver circuit by a factor of about 45 higher than that of a single-transistor current-mirror driver circuit of the same size. As a consequence, excellent current regulation is achieved: the voltage at node NLEDx can vary as much as +1 volt about the operating point without affecting the LED currents, $I_{L1X}$, by more than 0.16%. A third advantage of the cascoded current-mirror configuration is an excellent power supply rejection. The present circuit is suited to operate at an LED power supply, VLED, of 5 volts. As long as VLED is not reduced to below 4 volts, the circuit will stay in the saturation region. Under this condition, as VLED is varied, the gate voltages at the diode-connected transistors, MOAX and MOBY, will be adjusted automatically to sustain the same drain-to-source current, $I_{1x}$, thereby keeping the gate-to-source voltages of these two transistors, $(V_{GS})_{MOAX}$ and $(V_{GS})_{MOBX}$, fixed. Since the gates of M1AX and M1BX are tied to those of MOAX and MOBX, respectively, $(V_{GS})_{M1AX}$ and $(V_{GS})_{M1BX}$ also remains unchanged, thus causing the mirrored current, $I_{L1X}$, to stay constant.

8-Bit Current-Steering Multiplying Digital-to-Analog Converter (Circuit DA8Y)

Figure 3G:
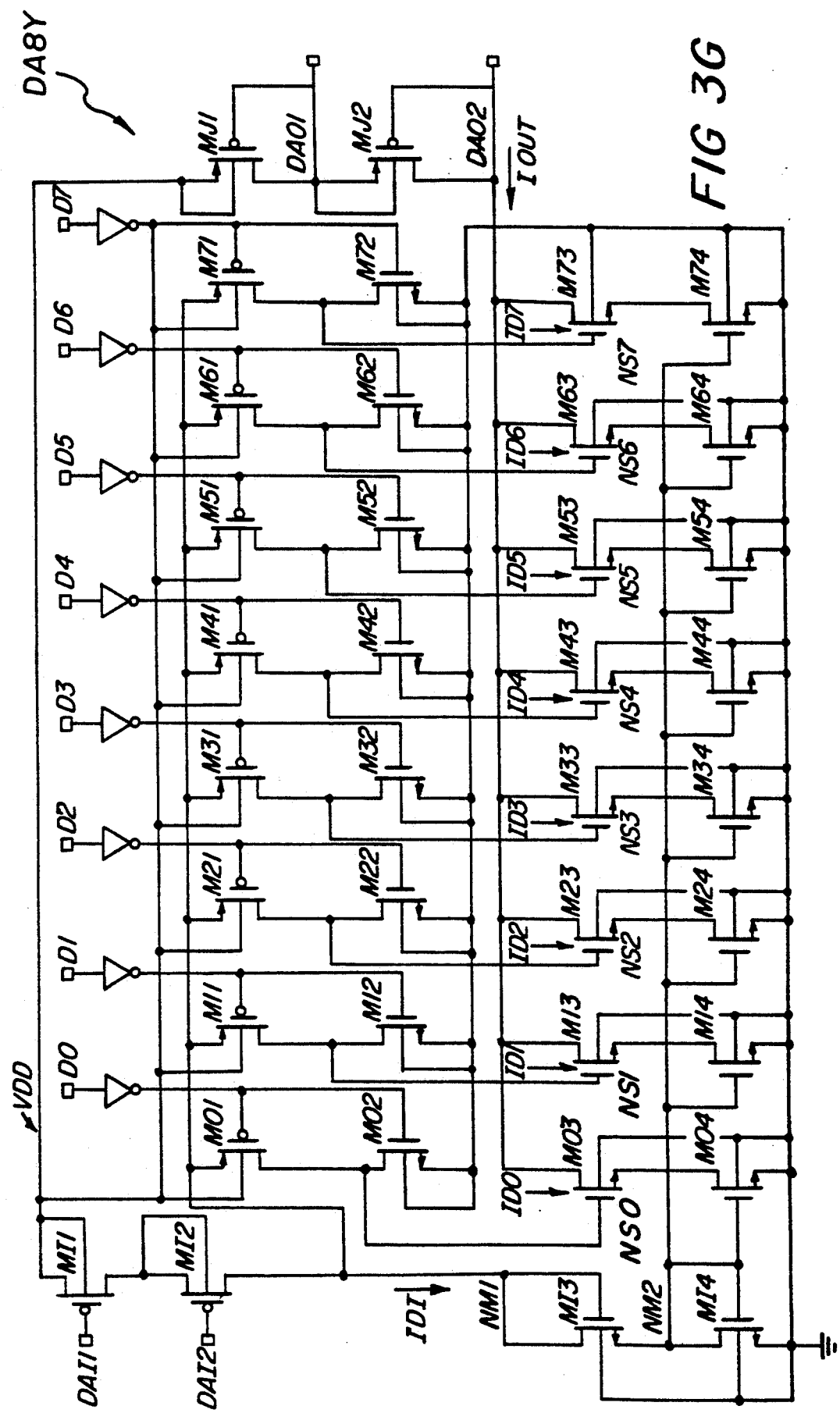

FIG. 3G shows the schematic diagram of the 8-bit current-steering multiplying digital-to-analog converter used in circuits Y2, Y3 and Y5. It is functionally speaking, a current-controlled current source with digitally programmable gain, whose transfer characteristics can be expressed by the following relationship:

$$I_{OUT} = I_{DI} \sum_{k=0}^{7} 2^k D_k$$

where $D_k$ is the binary weight of the input word D[0:7], $I_{DI}$ is the input current, and $I_{OUT}$ is the output current.

Circuit DA8Y is sized and biased to operate with both the input and output current range centering around 5 μa when the input digital word, D[0:7], is set to mid-range, i.e., 80(hex). Detailed discussion of the operation of the circuit is described in the following paragraphs.

The value of the input current, $I_{DI}$, is set up by transistors MI1 and MI2 in response to the gate voltages developed at nodes DAI1 and DAI2 by the action of cascoded current-mirroring with its preceding stage. This current is then reflected to an array of eight slave cascoded current-mirror pairs, Mx3 and Mx4, where x=0,1,2,...7 from the master input transistor pair, MI3 and MI4, through the voltages developed at nodes NM1 and NM2, depending on the states of the corresponding bits of the input digital word, D[0:7].

Transistors Mx1 and Mx2 constitute a STDP (single-throw double-pole) switch responding to the state of the digital input bit $D_x$. When $D_x$ is set high, nodes NSx and NM1 are connected together, enabling the action of current mirroring to be established between the master and slave-cascoded transistors pairs, MI3 and MI4, and Mx3 and Mx4, respectively. A reflected current, $I_{Dx}$, is thus caused to flow through transistor pair, Mx3 and Mx4 whose value can be expressed by the following equation:

$$I_{Dx} = I_{DI} \frac{\left(\frac{W}{L}\right)_{Mx4}}{\left(\frac{W}{L}\right)_{MI4}}$$

where x=0,1,2,...7.

When transistors Mx4 (and similarly Mx3) are sized such that $$\left(\frac{W}{L}\right)_{Mx4} = 2^x \left(\frac{W}{L}\right)_{MI4}$$

the expression for the reflected current can be simplified to assume the form:

$$I_{Dx} = 2^x I_{DI}.$$

When the data bit, $D_x$, is set low, transistor Mx2 is turned on, causing node NSx to be shorted to ground. As a result, transistor Mx3 is turned off, because at this point $(V_{GS})_{Mx3} \leq 0$, thereby prohibiting current flow through the cascoded-slave current-mirror pair, Mx3 and Mx4, namely, $I_{Dx}=0$ when $D_x=0$. The action of the digital input bit, $D_x$, on the branch current, $I_{Dx}$ can be summarized as:

$$I_{Dx} = 2^x I_{DI} D_x.$$

Note that the drain outputs of all the slave current-mirror transistors are tied together at node DA02. This means that the branch currents, $I_{D0}$ through $I_{D7}$, are in effect summed to yield the output current $I_{OUT}$:

$$I_{OUT} = \sum_{k=0}^{7} I_{Dk}$$

which can be expressed in terms of the input current $I_{DI}$ as follows $$I_{OUT} = I_{DI} \sum_{k=0}^{7} 2^k D_k.$$

Thus, this circuit provides an output current which is a product of the input current, $I_{DI}$, and the binary weighted sum of the input digital word, D[0:7]. This digitally-controlled output current from circuit DA8Y can be subsequently reflected to a following stage by means of the diode-connected transistor, MJ1 and MJ2, through the voltages developed at nodes DA01 and DA02.

One of the design considerations for this is that when $I_{OUT}$ varies from zero to full range, i.e., from 0 to 256 $I_{D0}$, all the transistors must be so biased that they continue to operate in the saturation region. This necessary condition is achieved by properly sizing the output summing transistors, MJ1 and MJ2, in such a way that when only the most significant bit (MSB) current, $I_{D7}$, is turned on, the voltage developed at node DA02 is almost identical to that developed at node NM1.

Another design consideration is the deviation from ideal current mirroring when ΔL and ΔW, the uncertainties in the channel length and channel width of a transistor due to process and photolithographic limitations, respectively, are taken into account. Deviation from perfect current mirroring can become quite substantial when the channel widths differ by more than one order of magnitude. This is particularly a problem where the channel width of the MSB transistor M74 is 128 times that of the LSB transistor M04. This can lead to gross non-linearity in the DAC transfer characteristics because the binary-weighted sum would not provide a faithful representation of the expected analog value. Such non-idealities of current mirroring due to process and photolithographic limitations can be circumvented by employing the concept of unit cell transistors arranged in a common centroid configuration. This is achieved by segmenting the slave transistor pairs, Mx3 and Mx4, such that each of them are composed of exactly $2^x$ number of unit transistors connected in parallel, with the size of the unit cell transistor coinciding with that of the LSB transistor, M04. In this scheme, the ratio of the active branch current corresponding to the xth bit, $D_x$, to that of $D_0$ is calculated to be:

$$\frac{I_{Dx}}{I_{D0}} = \frac{2^x(W_0 - \Delta W)}{W_0 - \Delta W} = 2^x$$

as desired for a faithful digital-to-analog conversion operation.

Another source of non-idealities in current mirrors can be attributed to the variation in threshold voltage over different areas of the wafer due to process non-uniformity.

In addition to placing the master and slave transistors in as close proximity as possible, this non-ideality in current mirroring due to threshold voltage variation can be compensated for by the use of a common centroid configuration in the layout of the circuit, as shown in FIG. 5. Each slave transistor corresponding to the xth bit, Mx4 (and similarly for Mx3) is divided into two halves, each of which consists of $2^{x-1}$ unit cell transistors connected in parallel. The two composite transistor halves of Mx4 are arranged symmetrically so that they nestle around those of the transistor corresponding to the lower order bit, $M(x-1)4$, with the least significant bit, LSB transistor being at the center, and the MSB halves at the outermost positions.

The definition of the centroid with respect to the threshold voltage can be shown to correspond mathematically to the normalized first moment of the statistical variable, $V_T$. From elementary statistics theory, it can be concluded from the above discussions that each one of the composite slave transistors laid out in this geometrical arrangement can be treated as a single transistor located at the centroid O with the same equivalent threshold voltage, $V_T$. Accordingly, errors in threshold voltage and current through each transistor can be made negligible by using such a technique, thereby allowing faithful current mirroring to be obtained.

As may be seen from FIG. 5, the transistors are formed into binary weighted groups of unit transistors which groups progressively increase in weight or size with distance from the centroid O. Thus, at the centroid is the single unit transistor M04 having a binary weight $2^\circ$. This unit transistor is comprised of a polysilicon gate overlapping a diffusion region whose two terminals form the drain and source. Just outwardly from the centroid are the two unit transistors each forming a half of the transistor M14 that are connected together by a metal lead. The two unit transistors are disposed, one one each side of the centroid and connected by lead $L_1$. The remaining binary weighted transistor groups are similarly formed except that starting for transistor M54 where 16 transistors are formed on each side of the centroid to form the 32 unit transistors comprising M54, two banks of eight unit transistors are formed and connected together in lieu of having a line of 16 transistors which may also be done. The still higher binary weighted transistors (not shown) follow the pattern of tying together the banks of 8 unit transistors as shown. Thus as can be seen, at least some of transistors forming the D/A converter can be formed as unit transistors and arranged in the common centroid pattern to provide the advantages described above.

There has thus been described a circuit where an output current can be made to be linearly dependent on temperature with programmable temperature coefficients. An application for this circuit is to compensate for the derating in the LED currents in a printhead as temperature increases. The slope of linearity, both in magnitude and in polarity, can be adjusted by means of an input current source, either through digital or analog control, or both. In this regard, a circuit providing a negative temperature coefficient may be provided by modifying the circuit Y4 so that the circuit-generating current $I_5$ is relocated to feed current $I_5$ into a node that sums currents $I_5$ and $I_6$ so that $I_4 = I_5 + I_6$. In such a case, the ratio of $I_{50}/I_{60}$ in equation 2.9 can be adjusted so that the numerator of equation 2.9 becomes negative, Linearity is achieved by a novel design such that one portion of the circuit operates in the weak-inversion region of MOS devices. Also, high power-supply rejection ratio is obtained by full utilization of the cascode current mirror configuration.

In-situ temperature monitoring is thus provided with programmable temperature profile for LED driving current.

Fully linear control from digital words to LED driving currents over desired operating ranges is also provided.

The system operates totally in the current mode, and true cascode current mirror configuration is used throughout to achieve a very high power-supply rejection ratio. The LED cascode driver stage has the advantages of significant area reduction, excellent current regulation regardless of LED load, fully linear control of LED current by input current over desired LED operating region and extremely high power-supply rejection ratio.

The invention has been described in detail with particular reference to preferred embodiments thereof, but it will be understood that variations and modifications can be effected within the spirit and scope of the invention.

We claim:

1. A printhead including
    a recording element energizable for emitting radiation used in recording; and
    driver circuitry for providing driving current to energize the recording element, the driver circuitry including a plurality of MOS transistors arranged as a cascode current mirror and biased in a weak-inversion saturated region to generate the driving current with a generally linear temperature profile.

2. The printhead of claim 1 and including a resistor in series with a plurality of transistors in one leg of the current mirror.

3. The printhead of claim 2 and including digitally programmable means in series with the resistor for co-operating with the resistor to define a programmable temperature coefficient.

4. The printhead of claim 3 and including a digital-to-analog converter for programmably modifying a level of current through the resistor, the converter including a plurality of unit transistors arranged in a common centroid configuration.

5. The printhead of claim 4 and wherein the unit transistors of the converter are connected in groups to form binary weighted transistor groups.

6. The printhead of claim 5 and wherein ones of the binary weighted groups of progressively higher binary weight are located progressively farther from a centroid.

7. The printhead of claim 6 and wherein the driver circuitry is located on an integrated circuit driver chip, a plurality of identical driver chips are located on the printhead and each of said chips provides driving currents to a plurality of the recording elements.

8. The printhead of claim 7 and wherein each of said driver chips includes a digital to analog converter, and the printhead includes means for providing identical digital word inputs to all of said driver chips.

9. The printhead of claim 8 and wherein driving current to each of the recording elements is generated in a respective master-slave current mirror circuit with each of the recording elements forming a part of a slave leg of each respective current mirror circuit and a master leg of each respective current mirror circuit is associated with only one recording element of the recording elements.

10. A printhead comprising:
a plurality of recording elements energizable for emitting radiation used in recording;
driver circuitry means including a plurality of master-slave current mirrors for generating driving currents to energize respective recording elements, each of said recording elements being a part of a slave leg of a respective one of said current mirrors and having a master circuit of each of the current mirrors in current driving relationship with only one of said recording elements;
and wherein the driver circuitry further includes a plurality of MOS transistors arranged as a cascode current mirror and biased in a weak-inversion saturated region to generate a first current with a generally linear temperature profile and said plurality of current mirrors are responsive to said first current for generating the driving currents.

11. The printhead of claim 10 and including programmable means for adjusting a temperature coefficient of one of said current mirrors.

12. The printhead of claim 10 and wherein the cascode current mirror provides a linear temperature profile to the first current.

13. The printhead of claim 12 and including a digital-to-analog converter for modifying the first current and including a plurality of unit transistors arranged in a common centroid configuration.

14. The printhead of claim 13 and wherein the unit transistors of the converter are connected in groups to form binary weighted transistor groups.

15. The printhead of claim 14 and wherein ones of the binary weighted groups of progressively higher binary weight are located progressively farther from a centroid.

16. The printhead of claim 15 and wherein the driver circuitry means is located on an integrated circuit driver chip, a plurality of identical driver chips are located on the printhead and each of said chips provides driving currents to a plurality of the recording elements.

17. A printhead comprising:
a recording element energizable for emitting radiation used in recording, and
driver circuitry for providing driving current to energize the recording element; the driver circuitry including a digital-to-analog converter for modifying a level of current to the recording element, the converter including a plurality of unit transistors arranged in a common centroid configuration to define a centroid, wherein the unit transistors of the converter are connected in groups to form binary weighted transistor groups, and wherein ones of the binary weighted groups of progressively higher binary weight are located progressively farther from the centroid.

18. The printhead of claim 17 and wherein the driver circuitry further includes a plurality of transistors arranged as a cascode current mirror and biased in a weak-inversion saturated region to generate the driving current with a generally linear temperature profile.

19. The printhead of claim 17 and wherein the driver circuitry includes means for generating a second current with a linear temperature profile to provide current to the recording element with a generally linear temperature profile.

20. A driver circuitry for providing driving current to energize a recording element, the driver circuitry comprising:
a plurality of MOS transistors arranged in a cascode, current mirror configuration and biased in a weak-inversion saturated region to generate the driving current with a generally linear temperature profile.

21. The driver circuitry of claim 20 and including a resistor in series with a plurality of transistors in one leg of a current mirror formed by said MOS transistors.

22. The driver circuitry of claim 21 and including digitally programmable means in series with the resistor for cooperating with the resistor to define a programmable temperature coefficient.

23. The driver circuitry of claim 22 and including a digital-to-analog converter for programmably modifying a level of current through the resistor, the converter including a plurality of unit transistors arranged in a common centroid configuration.

24. The driver circuitry of claim 23 and wherein the unit transistors of the converter are connected in groups to form binary weighted transistor groups.

25. The driver circuitry of claim 24 and wherein ones of the binary weighted groups of progressively higher binary weight are located progressively farther from a centroid.

26. The driver circuitry of claim 25 and wherein the driver circuitry is located on an integrated circuit driver chip.

27. The driver circuitry of claim 26 and including a plurality of master-slave current mirror circuit means each for coupling of a respective recording element with a transistor forming a part of a slave leg of each current mirror circuit means and a master leg of each of the plurality of current mirror circuit means is associated with only one recording element.

28. A driver circuitry for providing driving currents to energize a plurality of recording elements, the driver circuitry comprising:
a plurality of master-slave current mirror means for generating driving currents to energize respective recording elements, each current mirror means including a transistor for driving a respective one of said recording elements and forming a part of a respective slave leg of each current mirror means and each current mirror means including a respective master circuit that is in master-slave relationship with said respective slave leg so that the master circuit is associated with only one recording element;
and wherein the driver circuitry further includes a plurality of MOS transistors arranged as a cascode current mirror and biased in a weak-inversion saturated region to generate a first current with a generally linear temperature profile and said plurality of current mirror means are responsive to said first current for generating the driving currents.

29. The driver circuitry of claim 28 and including programmable means for adjusting a temperature coefficient of the cascode current mirror.

30. The driver circuitry of claim 28 and wherein the cascode current mirror provides a linear temperature profile to the first current.

31. The driver circuitry of claim 30 and including a digital-to-analog converter for modifying the first current and including a plurality of unit transistors arranged in a common centroid configuration to define a centroid.

32. The driver circuitry of claim 31 and wherein the unit transistors of the converter are connected in groups to form binary weighted transistor groups.

33. The driver circuitry of claim 32 and wherein ones of the binary weighted groups of progressively higher binary weight are located progressively farther from the centroid.

34. The driver circuitry of claim 33 and wherein the driver circuitry is located on an integrated circuit driver chip.

35. A driver circuitry for providing driving current to energize a recording element; the driver circuitry comprising:
a digital to-analog converter for modifying a level of current to the recording element, the converter including a plurality of unit transistors arranged in a common centroid configuration to define a centroid, wherein the unit transistors of the converter are connected in groups to form binary weighted transistor groups, and wherein ones of the binary weighted groups of progressively higher binary weight are located progressively farther from the centroid.

36. The driver circuitry of claim 35 and wherein the driver circuitry further includes a plurality of transistors arranged in a cascode current mirror configuration and biased in a weak-inversion saturated region to generate a first current with a generally linear temperature profile.

37. The driver circuitry of claim 36 and wherein the driver circuitry further includes means, responsive to said first current, for generating a second current with a linear temperature profile for driving a recording element.

38. The driver circuitry of claim 36 and including second current mirror means for generating a second current that mirrors the first current, programmable means for branching a portion of said second current to generate a third current that is provided with a linear temperature profile and current mirror means responsive to said second current for generating the driving current.

* * * * *